US012587189B2

(12) United States Patent
Seikoba et al.

(10) Patent No.: US 12,587,189 B2
(45) Date of Patent: Mar. 24, 2026

(54) DRIVE CIRCUIT

(71) Applicant: Mitsubishi Electric Corporation, Tokyo (JP)

(72) Inventors: Yu Seikoba, Tokyo (JP); Shohei Sano, Fukuoka (JP); Yo Habu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 18/412,490

(22) Filed: Jan. 13, 2024

(65) Prior Publication Data

US 2024/0340006 A1    Oct. 10, 2024

(30) Foreign Application Priority Data

Apr. 6, 2023    (JP) ................................. 2023-062211

(51) Int. Cl.
H03K 17/687 (2006.01)
H03K 17/0814 (2006.01)
H03K 17/30 (2006.01)

(52) U.S. Cl.
CPC ... H03K 17/6871 (2013.01); H03K 17/08142 (2013.01); H03K 17/302 (2013.01); *H03K 2217/0027* (2013.01)

(58) Field of Classification Search
CPC ......... H03K 17/6871; H03K 17/08142; H03K 17/302; H03K 2217/0027; H03K 17/0822; H03K 17/08116; H03K 17/567
See application file for complete search history.

(56) References Cited

U.S. PATENT DOCUMENTS

| | | | | |
|---|---|---|---|---|
| 9,184,743 B2 * | 11/2015 | Shimizu | .............. | H03K 17/082 |
| 2009/0021294 A1 | 1/2009 | Morishita et al. | | |
| 2015/0049531 A1 | 2/2015 | Yamanaka | | |
| 2016/0099665 A1 * | 4/2016 | Chen | ................ | H02M 7/53871 |
| | | | | 363/56.02 |

(Continued)

FOREIGN PATENT DOCUMENTS

| | | |
|---|---|---|
| JP | 2003-134797 A | 5/2003 |
| JP | 2006-320087 A | 11/2006 |

(Continued)

OTHER PUBLICATIONS

An Office Action, "Notice of Reasons for Refusal," mailed by the Japanese Patent Office on Feb. 3, 2026, which corresponds to Japanese Patent Application No. 2023-062211 and is related to U.S. Appl. No. 18/412,490; with English language translation.

*Primary Examiner* — Metasebia T Retebo

(74) *Attorney, Agent, or Firm* — Studebaker Brackett PLLC

(57) ABSTRACT

A gate driver IC includes a plurality of switching elements that drives an IGBT; a comparator that outputs an alarm signal in a case where a potential of a shunt resistor connected between an emitter terminal of the IGBT and a ground is equal to or higher than a Vth1; a delay circuit that outputs a trigger signal after the comparator starts outputting the alarm signal; and a controller that controls on and off of the plurality of switching elements. The switching elements of an upper arm include PMOSs connected to a same voltage source. The switching elements of a lower arm include NMOSs. The controller turns off the PMOS when the alarm signal is output, and turns on the NMOS when the trigger signal is output.

10 Claims, 17 Drawing Sheets

(56) References Cited

U.S. PATENT DOCUMENTS

2016/0248243 A1 * 8/2016 Yanagishima ......... H02H 3/087

FOREIGN PATENT DOCUMENTS

| JP | 2010-034701 A | 2/2010 |
|----|---------------|--------|
| JP | 2013-225820 A | 10/2013 |
| JP | 2014-117112 A | 6/2014 |
| JP | 2015-061406 A | 3/2015 |
| JP | 2016-187296 A | 10/2016 |
| JP | 2021-129396 A | 9/2021 |

* cited by examiner

F I G .  1
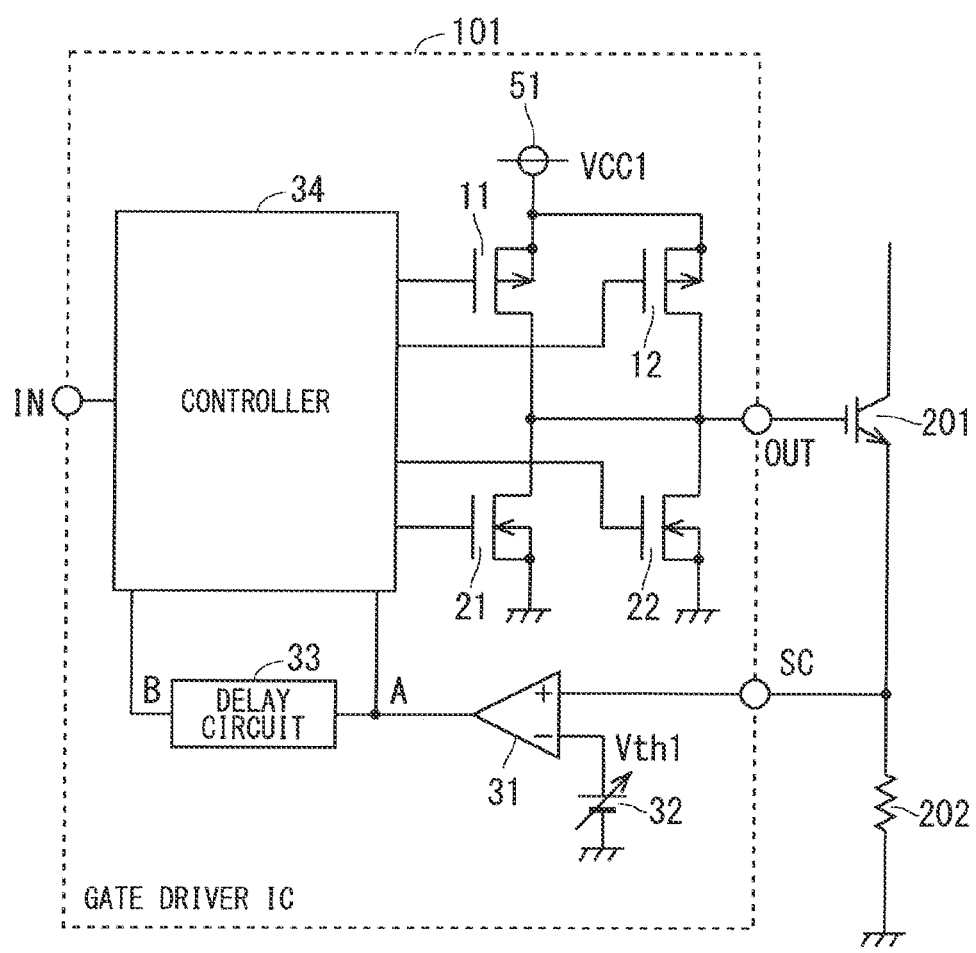

F I G. 2
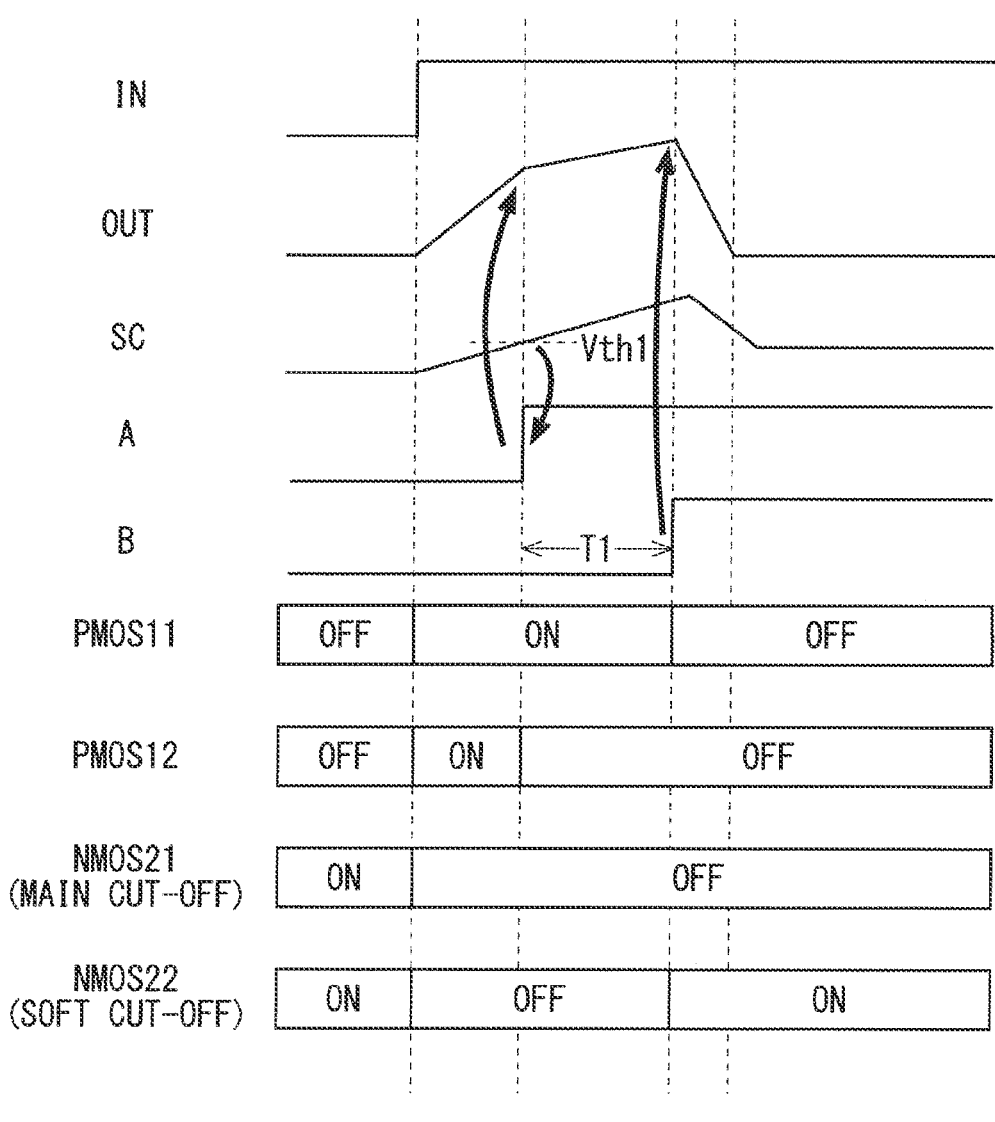

F I G.  3
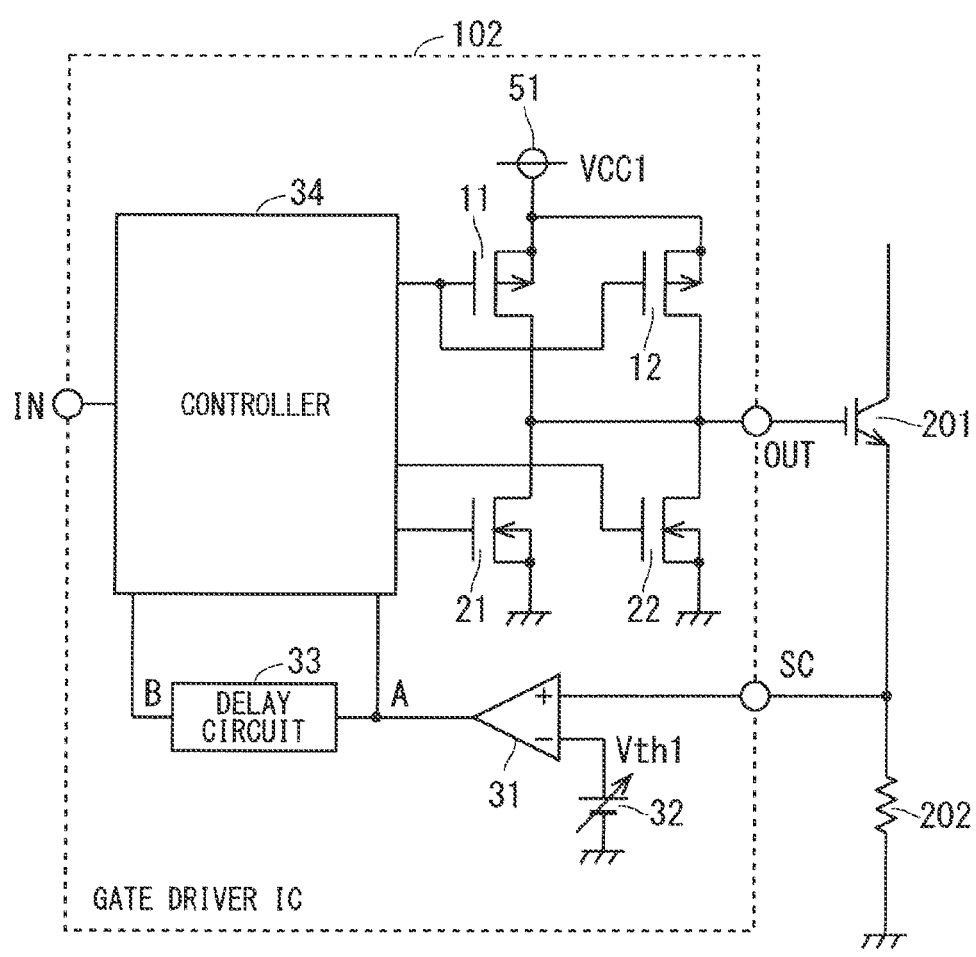

F I G . 4
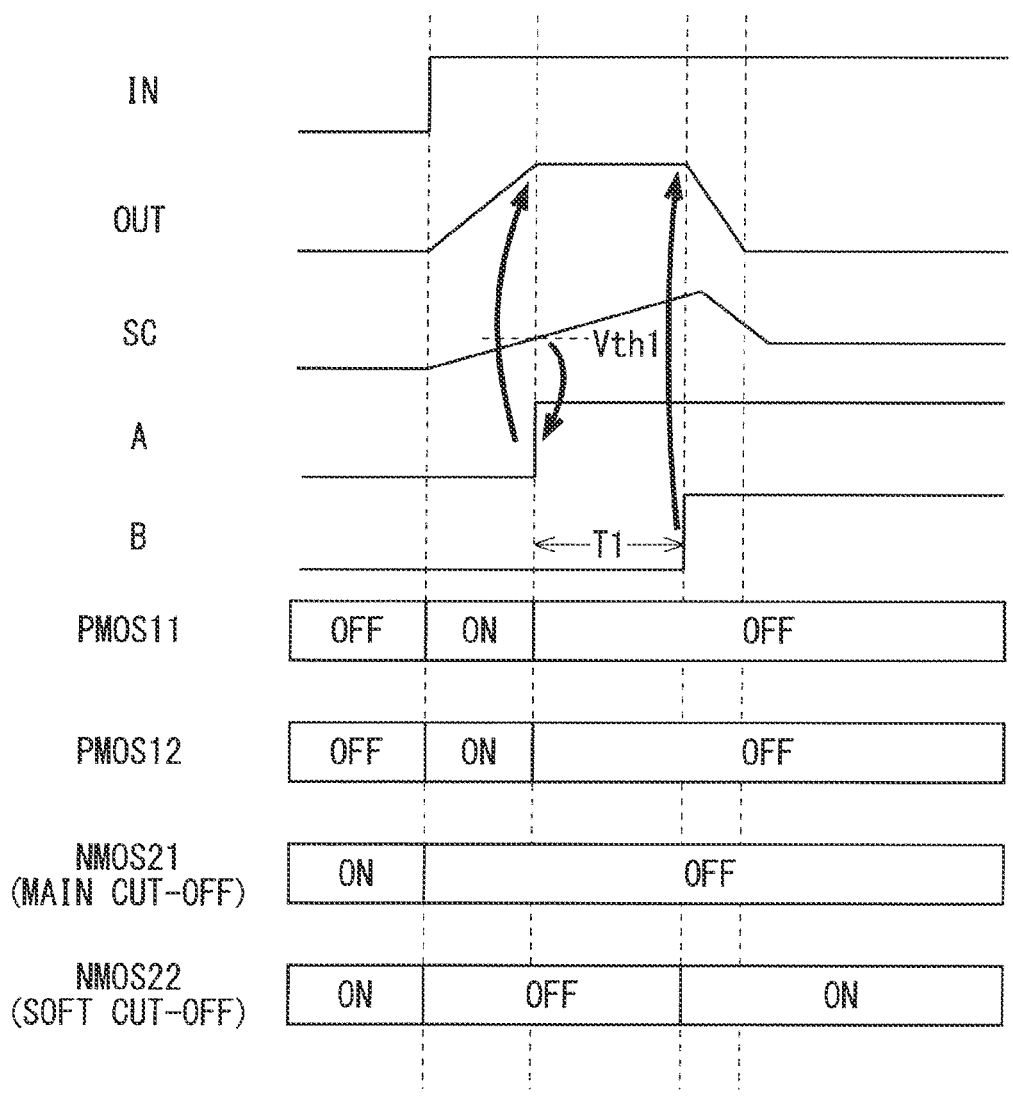

F I G. 5
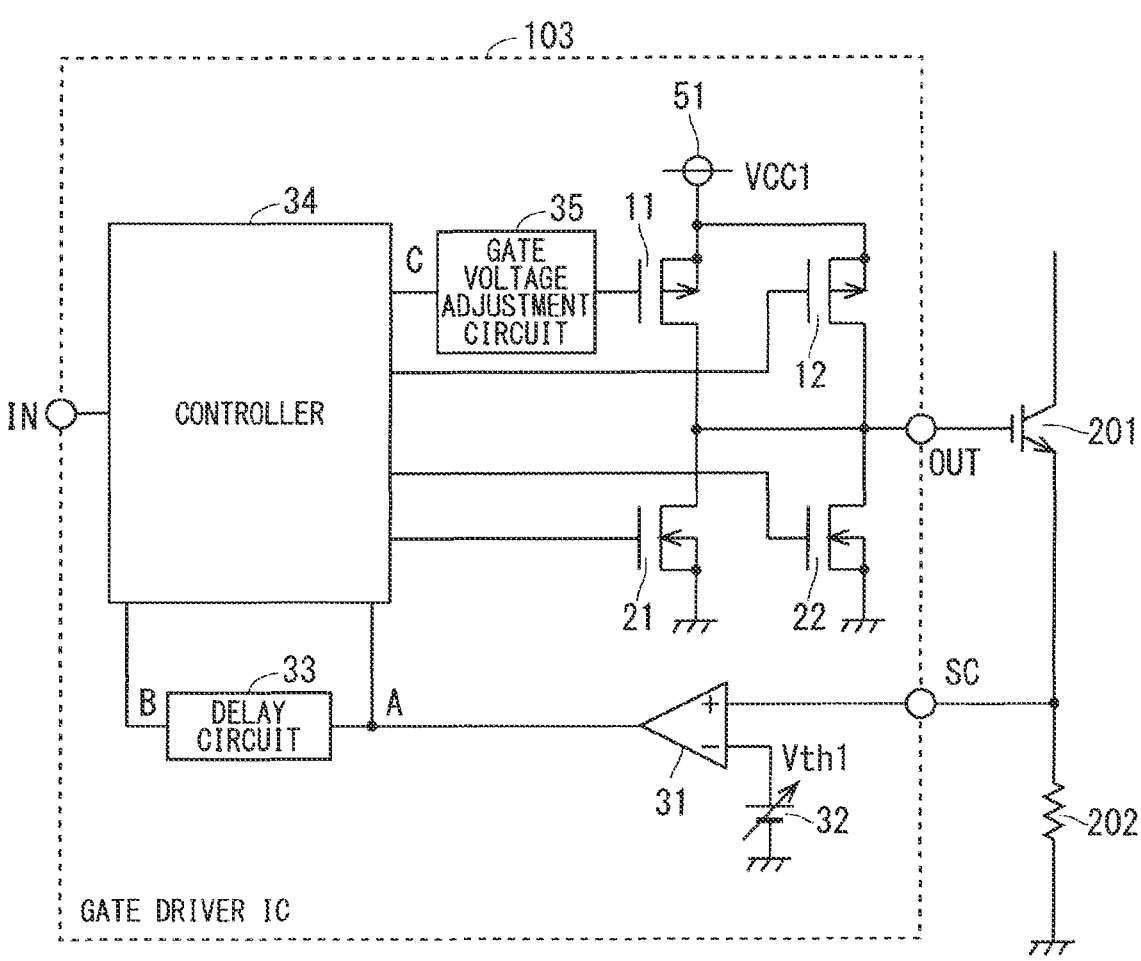

F I G. 7
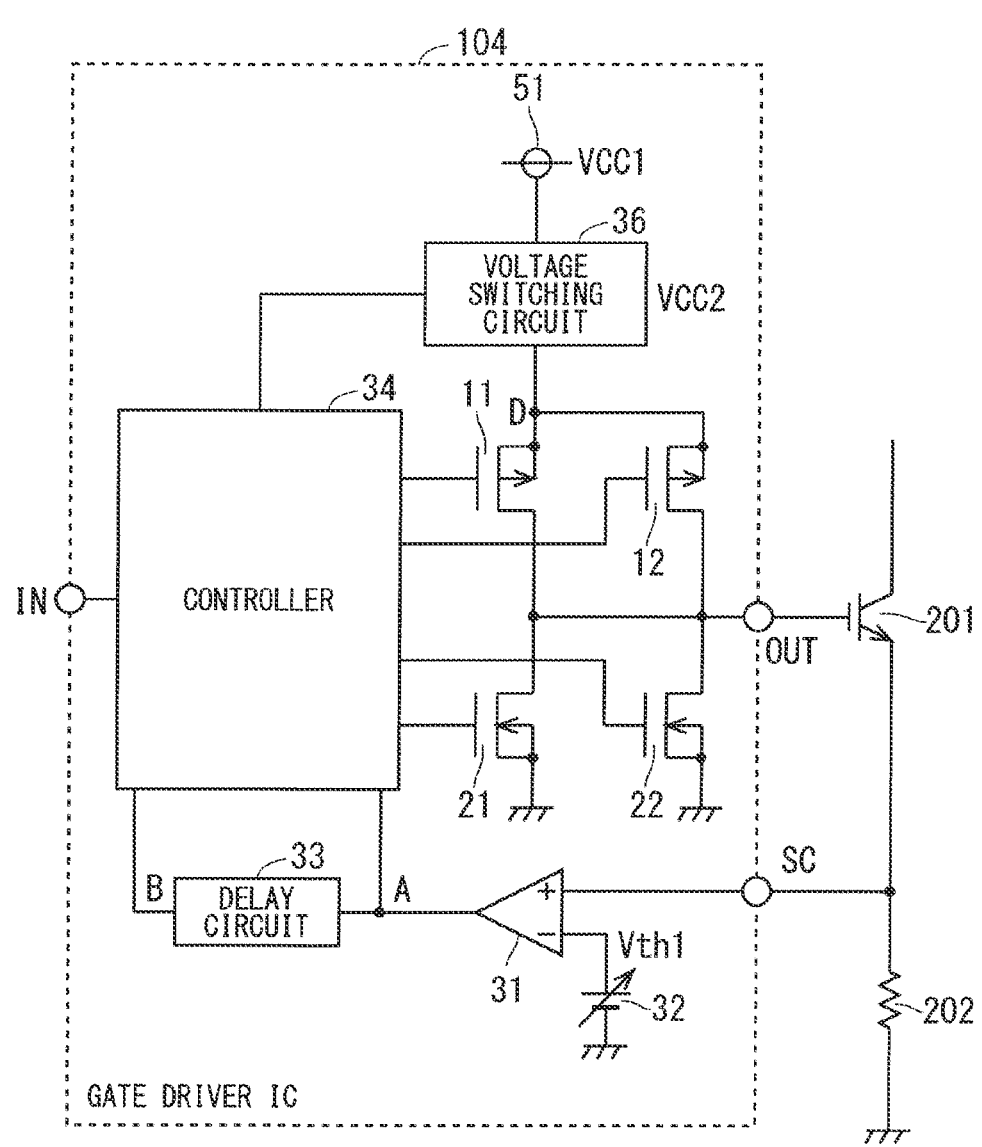

F I G . 9
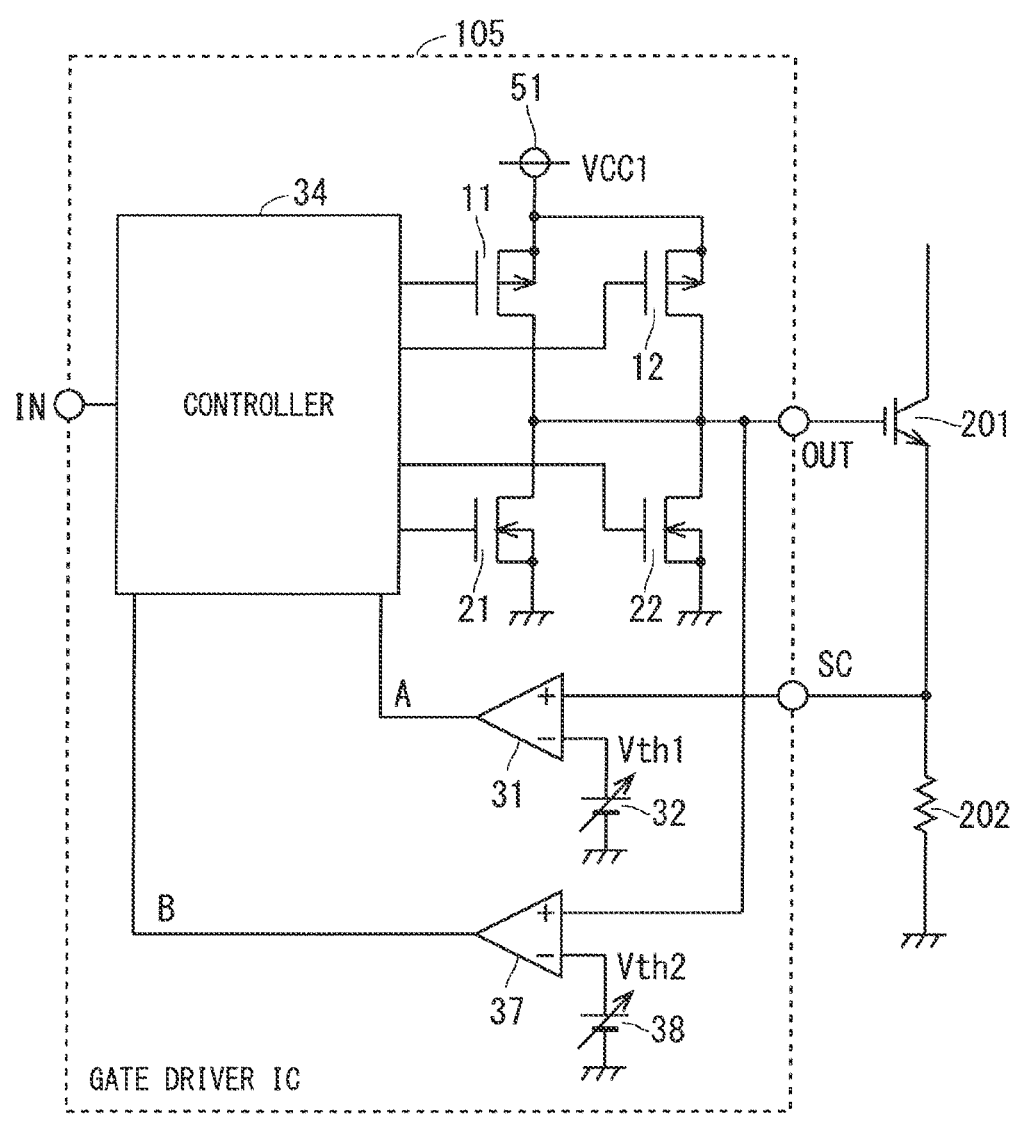

F I G. 1 0
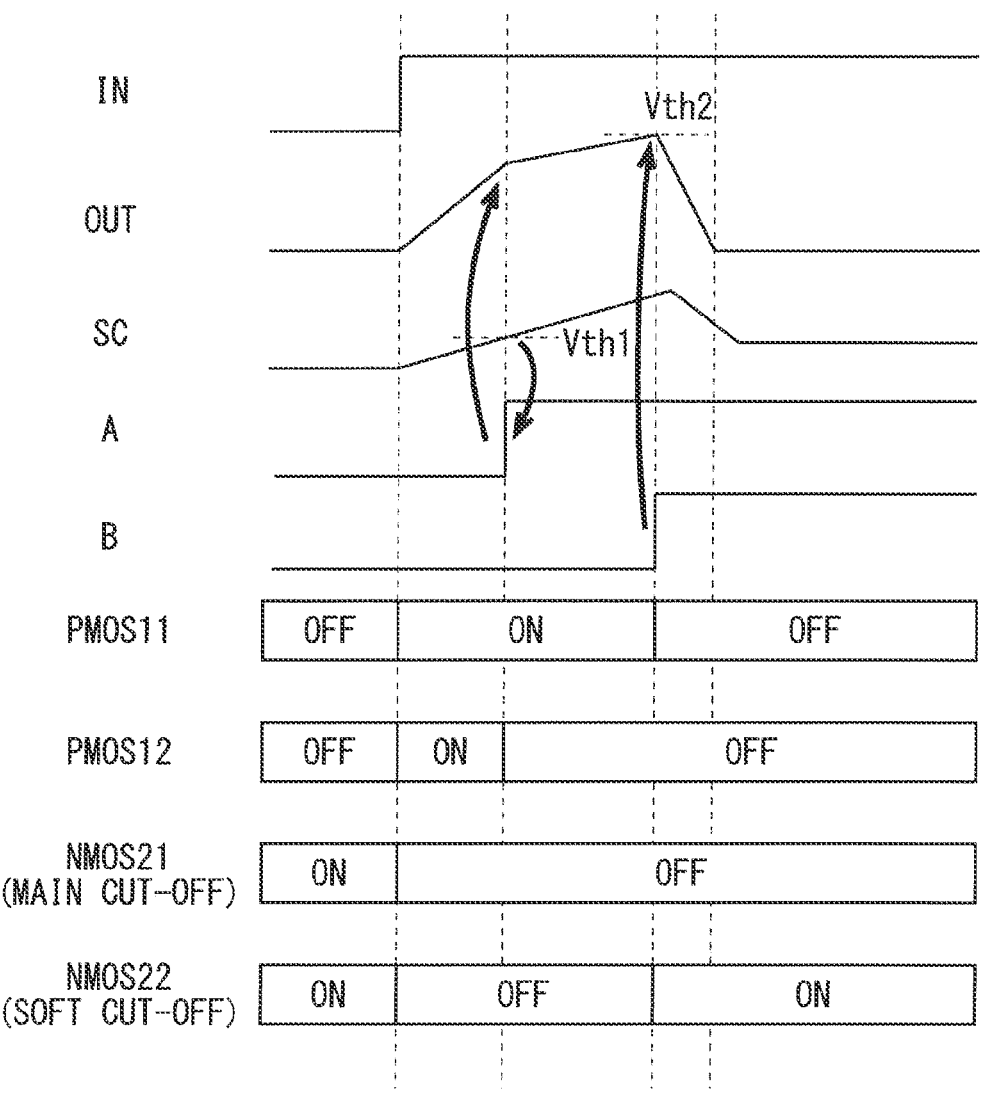

F I G .  1 2
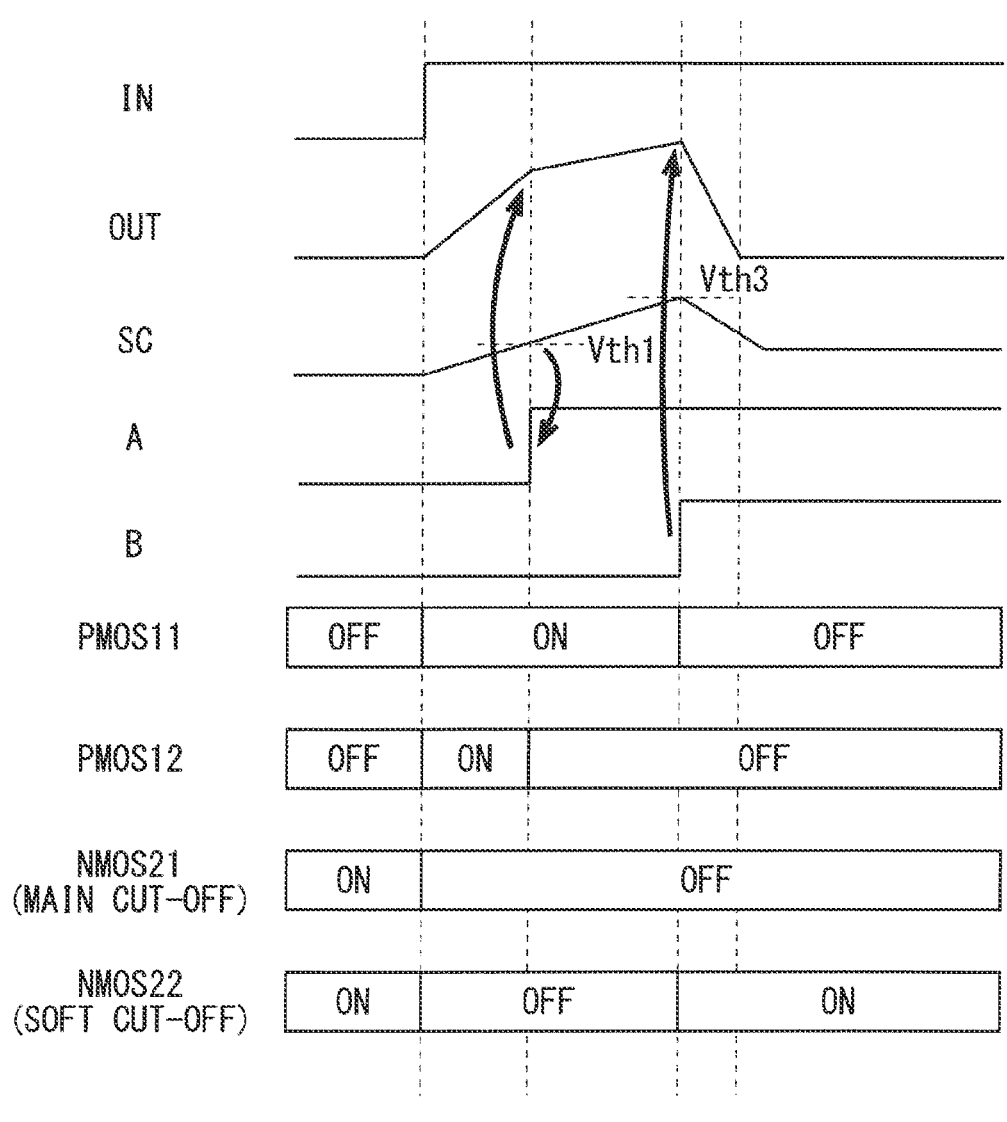

F I G.  1 6
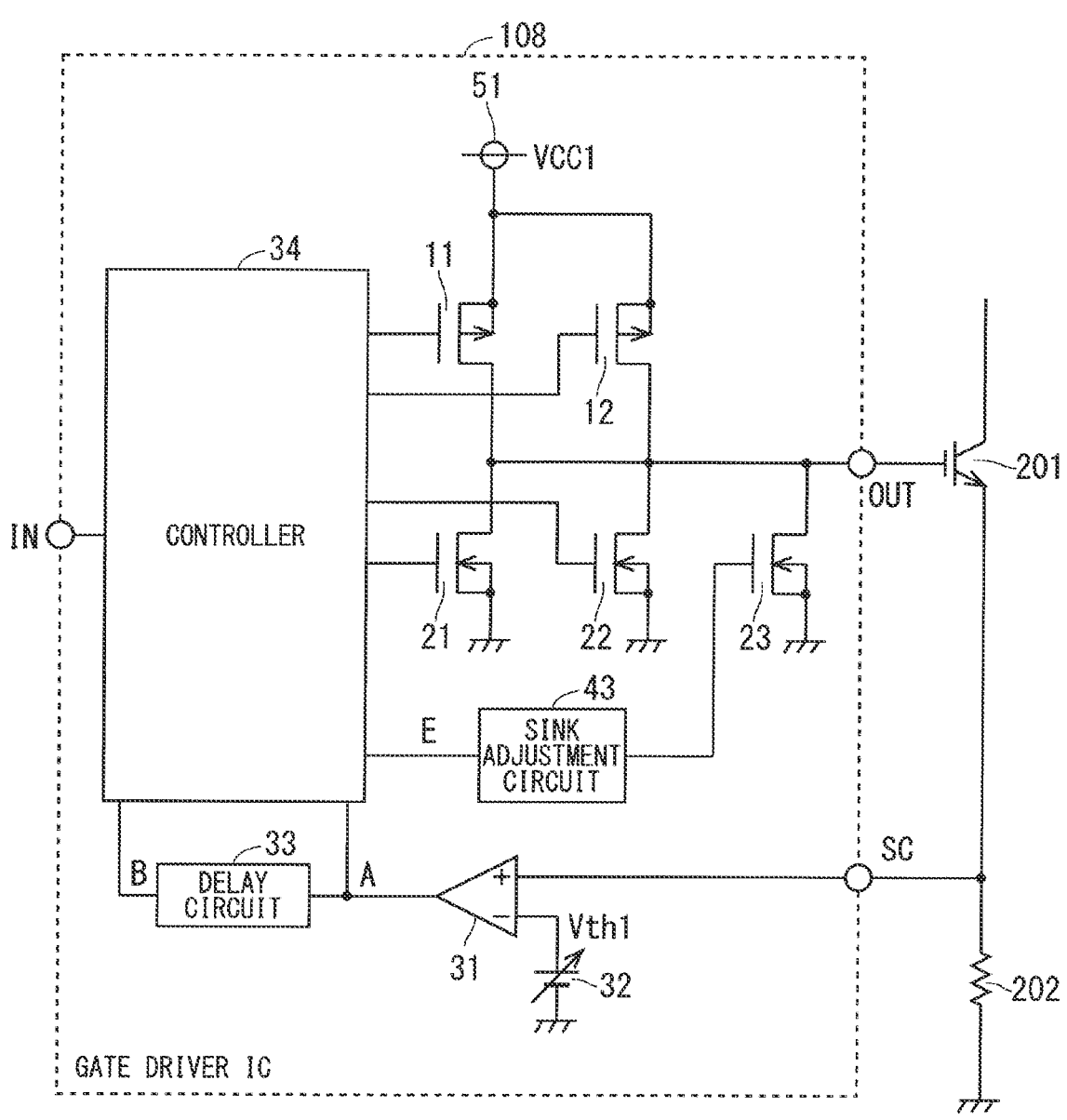

F I G.  1 7
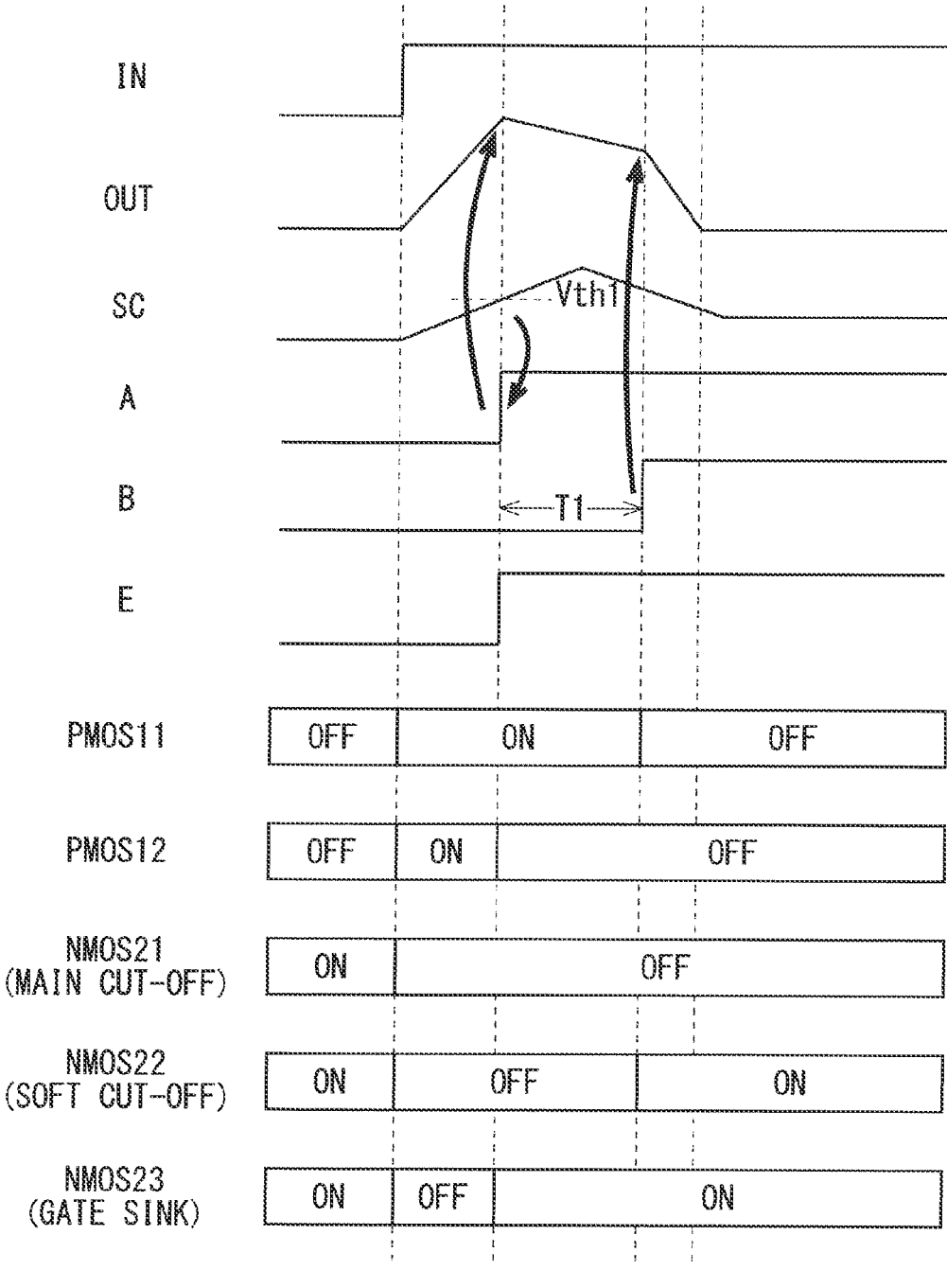

DRIVE CIRCUIT

BACKGROUND OF THE INVENTION

Field of the Invention

The present disclosure relates to a drive circuit for a power semiconductor element.

Description of the Background Art

Japanese Patent Application Laid-Open No. 2003-134797 discloses a drive circuit that, when a short circuit occurs in an insulated gate bipolar transistor (IGBT), conducts a switching element of a lower arm connected to a gate of the IGBT to suppress a current flowing to the gate of the IGBT, thereby suppressing a surge voltage at the time of soft cut-off of the IGBT.

In the drive circuit of Japanese Patent Application Laid-Open No. 2003-134797, the switching element of the lower arm is required in order to reduce the current flowing to the gate of the IGBT. In addition, there is a problem that power consumption increases by short-circuiting the switching element of an upper arm and the switching element of the lower arm.

SUMMARY

An object of the technology of the present disclosure is to provide a drive circuit that suppresses a surge voltage when a short circuit occurs in a power semiconductor element while suppressing power consumption with a small-scale configuration.

A drive circuit of the present disclosure includes a plurality of switching elements, an overcurrent detector, a trigger signal generation circuit, and a controller.

The plurality of switching elements drives a power semiconductor element.

The overcurrent detector outputs an alarm signal in a case where a potential of a shunt resistor connected between a main terminal of the power semiconductor element and a ground is equal to or higher than a predetermined first threshold.

The trigger signal generation circuit outputs a trigger signal after the overcurrent detector starts outputting the alarm signal.

The controller controls on and off of the plurality of switching elements.

The plurality of switching elements includes switching elements of an upper arm, and switching elements of a lower arm.

The switching elements of the upper arm include a first upper switching element and a second upper switching element that are connected to a same power supply.

The switching elements of the lower arm include a first lower switching element and a second lower switching element.

The controller turns off the second upper switching element when the alarm signal is output, and turns on the second lower switching element when the trigger signal is output.

With the drive circuit of the present disclosure, it is possible to configure the lower arm using the first lower switching element for main cut-off and the second lower switching element for soft cut-off, and thus a circuit scale can be reduced.

In addition, since the switching elements of the upper arm and the switching elements of the lower arm are not short-circuited, it is possible to suppress a surge voltage while suppressing power consumption, and to enhance reliability of a protection function when a short circuit occurs.

In addition, since a plurality of drive power supplies is not required for the switching elements of the upper arm, the circuit scale can be reduced.

These and other objects, features, aspects and advantages of the present disclosure will become more apparent from the following detailed description of the present disclosure when taken in conjunction with the accompanying drawings.

BRIEF DESCRIPTION OF THE DRA WINGS

FIG. 1 is a circuit diagram of a drive circuit according to a first preferred embodiment;

FIG. 2 is a diagram illustrating an operation of the drive circuit according to the first preferred embodiment;

FIG. 3 is a circuit diagram of a drive circuit according to a second preferred embodiment;

FIG. 4 is a diagram illustrating an operation of the drive circuit according to the second preferred embodiment;

FIG. 5 is a circuit diagram of a drive circuit according to a third preferred embodiment;

FIG. 7 is a circuit diagram of a drive circuit according to a fourth preferred embodiment;

FIG. 9 is a circuit diagram of a drive circuit according to a fifth preferred embodiment;

FIG. 10 is a diagram illustrating an operation of the drive circuit according to the fifth preferred embodiment;

FIG. 12 is a diagram illustrating an operation of the drive circuit according to the sixth preferred embodiment;

FIG. 16 is a circuit diagram of a drive circuit according to an eighth preferred embodiment; and FIG. 17 is a diagram illustrating an operation of the drive circuit according to the eighth preferred embodiment.

DESCRIPTION OF THE PREFERRED EMBODIMENTS

A. First Preferred Embodiment

<A-1. Configuration>

Figure 6:
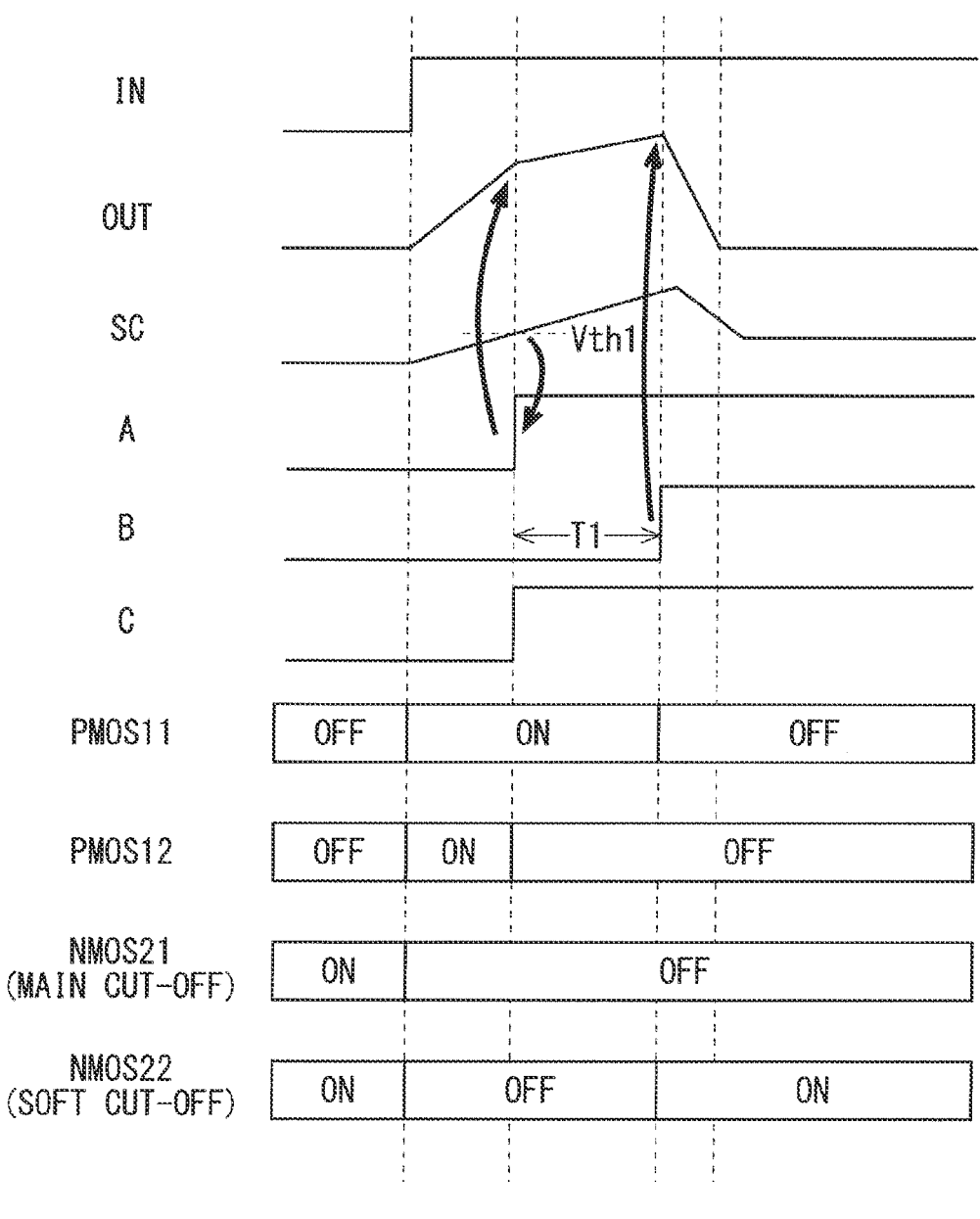
FIG. 6 is a diagram illustrating an operation of the drive circuit according to the third preferred embodiment.

FIG. 1 is a circuit diagram of a gate driver integrated circuit (IC) 101 that is a drive circuit according to the first preferred embodiment. The gate driver IC 101 drives an IGBT 201 which is a power semiconductor element. The gate driver IC 101 includes an input terminal IN, an output terminal OUT, and a short circuit detection terminal SC. The output terminal OUT is connected to a gate terminal which is a control terminal of the IGBT 201. An emitter terminal which is a main terminal of the IGBT 201 is connected to the ground via a shunt resistor 202. The short circuit detection terminal SC is connected between the emitter terminal of the IGBT 201 and the shunt resistor 202.

The gate driver IC 101 includes a P-channel metal oxide semiconductor (PMOS) 11 and a PMOS 12 as switching elements in an upper stage, that is, an upper arm, and includes an N-channel metal oxide semiconductor (NMOS) 21 and an NMOS 22 as switching elements in a lower stage, that is, a lower arm. The PMOS 11 and the PMOS 12 are also referred to as a first upper switching element and a second upper switching element, and the NMOS 21 and the NMOS 22 are also referred to as a first lower switching element and a second lower switching element.

Source terminals of the PMOS 11 and the PMOS 12 are connected to the same voltage source 51, and drain terminals thereof are connected to the gate terminal of the IGBT 201 via the output terminal OUT. Gate terminals of the PMOS 11 and the PMOS 12 are connected to a controller 34. The voltage source 51 supplies a voltage VCC1. Source terminals of the NMOS 21 and the NMOS 22 are connected to the ground, and drain terminals thereof are connected to the gate terminal of the IGBT 201 via the output terminal OUT. Gate terminals of the NMOS 21 and the NMOS 22 are connected to the controller 34.

Further, the gate driver IC 101 includes a comparator 31, a variable DC power supply 32, a delay circuit 33, and the controller 34. The + input terminal of the comparator 31 is connected to the short circuit detection terminal SC, and the − input terminal is connected to the ground via the variable DC power supply 32. The variable DC power supply 32 applies a threshold voltage Vth1 to the − input terminal of the comparator 31. When an overcurrent occurs in the IGBT 201, the voltage drop in the shunt resistor 202 increases, and the emitter voltage applied to the + input terminal of the comparator 31 becomes equal to or higher than the threshold voltage Vth1. At this time, the output of the comparator 31 changes from Low to High. The high level signal of the comparator 31 is referred to as an alarm signal. As described above, the comparator 31 functions as an overcurrent detector that determines that an overcurrent has occurred in the IGBT 201 and outputs an alarm signal in a case where the potential of the shunt resistor is equal to or higher than the threshold voltage Vth1.

An output terminal of the comparator 31 is connected to the delay circuit 33 and the controller 34. A point between the comparator 31, and the delay circuit 33 and the controller 34 is defined as a point A. When the alarm signal is input, the controller 34 turns off the PMOS 12 to slow the increase in the gate voltage of the IGBT 201.

When the input of the alarm signal from the comparator 31 continues for a predetermined duration time T1, the delay circuit 33 changes its output from Low to High. The high level signal of the delay circuit 33 is referred to as a trigger signal. As described above, the delay circuit 33 functions as a trigger signal generation circuit that outputs the trigger signal after the comparator 31 starts outputting the alarm signal.

The output of the delay circuit 33 is input to the controller 34. A point between the delay circuit 33 and the controller 34 is defined as a point B. The controller 34 is connected to the input terminal IN. When the trigger signal is input from the delay circuit 33, the controller 34 turns off the PMOS 11, that is, makes the PMOS 11 non-conductive, and turns on the NMOS 22, that is, makes the NMOS 22 conductive, thereby causing the soft cut-off of the IGBT 201. Thus, the trigger signal functions as a trigger for the soft cut-off.

<A-2. Operation>

FIG. 2 is a diagram illustrating an operation of the gate driver IC 101. First, when the voltage applied to the input terminal IN is at the low level, the controller 34 turns off the PMOSs 11 and 12 and turns on the NMOSs 21 and 22. As a result, a low level voltage is applied to the output terminal OUT via the NMOSs 21 and 22, and the IGBT 201 is turned off.

When a high level voltage is applied to the input terminal IN, the controller 34 turns on the PMOSs 11 and 12 and turns off the NMOSs 21 and 22. As a result, the current flows from the PMOSs 11 and 12 to the output terminal OUT, and the voltage of the output terminal OUT increases. Accordingly, the emitter current of the IGBT 201 also increases, and the voltage drop across the shunt resistor 202 increases, so that the voltage of the short circuit detection terminal SC also increases.

When the voltage of the short circuit detection terminal SC becomes equal to or higher than the threshold voltage Vth1, the comparator 31 outputs the alarm signal to the delay circuit 33 and the controller 34. The controller 34 having received the alarm signal turns off the PMOS 12. As a result, the increase in the gate voltage of the IGBT 201 becomes gentle.

Thereafter, when the output of the alarm signal by the comparator 31 continues for the predetermined time T1, the delay circuit 33 outputs an alarm continuation signal to the controller 34. The controller 34 having received the alarm continuation signal turns off the PMOS 11 and turns on the NMOS 22. As a result, the gate voltage of the IGBT 201 drops, and accordingly, the voltage of the short circuit detection terminal SC also drops. This is referred to as the soft cut-off of the IGBT 201.

<A-3. Modification Example>

In the above description, the power semiconductor element driven by the gate driver IC 101 is an IGBT, but the power semiconductor element may be an FET including a wide band gap element that can be driven at a high speed, such as a SiC-metal oxide semiconductor field effect transistor (MOSFET) or a GaN-FET. Since these elements are driven at a higher speed than the IGBT, the surge voltage when a short circuit occurs may further increase. Therefore, the effect of surge suppression by the gate driver IC 101 is further exhibited. Note that the same applies to other preferred embodiments described below.

<A-4. Effect>

The gate driver IC 101 includes a plurality of switching elements that drives the IGBT 201 that is a power semiconductor element, the comparator 31 as the overcurrent detector, the delay circuit 33 as the trigger signal generation circuit that outputs the trigger signal after the comparator 31 starts outputting the alarm signal, and the controller 34 that controls on and off of the plurality of switching elements. The comparator 31 outputs the alarm signal in a case where the potential of the shunt resistor 202 connected between the main terminal of the IGBT 201 and the ground is equal to or higher than the predetermined threshold voltage Vth1. The plurality of switching elements includes switching elements of an upper arm, and switching elements of a lower arm. The switching element of the upper arm includes the PMOS 11 that is the first upper switching element and the PMOS 12 that is the second upper switching element that are connected to the same voltage source 51. The switching element of the lower arm includes the NMOS 21 that is the first lower switching element and the NMOS 22 that is the second lower switching element. The controller 34 turns off the PMOS 12 when the alarm signal is output, and turns on the NMOS 22 when the trigger signal is output.

According to the above configuration, since the lower arm of the gate driver IC 101 includes the NMOS 21 for main cut-off and the NMOS 22 for soft cut-off, the circuit scale can be reduced. In addition, since the PMOSs 11 and 12, which are the switching elements at the upper stage, and the NMOSs 21 and 22, which are the switching elements at the lower stage, are not short-circuited, it is possible to suppress the surge voltage while suppressing the power consumption, and to enhance the reliability of a protection function when a short circuit occurs. In addition, since a plurality of drive power supplies is not required for the switching elements of the upper arm, the circuit scale can be reduced.

B. Second Preferred Embodiment

<B-1. Configuration>

FIG. 3 is a circuit diagram of a gate driver IC 102 that is a drive circuit according to the second preferred embodiment. The gate driver IC 102 is different from the gate driver IC 101 according to the first preferred embodiment only in that gate terminals of the PMOS 11 and the PMOS 12 are connected to each other.

<B-2. Operation>

FIG. 4 is a diagram illustrating an operation of the gate driver IC 102. In the first preferred embodiment, when the comparator 31 detects the overcurrent, the PMOS 11 remains on, and only the PMOS 12 is turned off. However, in the present preferred embodiment, when the comparator 31 detects the overcurrent, both the PMOSs 11 and 12 are turned off. Other operations are the same as those in the first preferred embodiment.

<B-3. Effect>

With the gate driver IC 102 of the present preferred embodiment, the gate terminals of the PMOSs 11 and 12 are connected to each other, and the PMOSs 11 and 12 are turned off at the time of overcurrent detection, so that current supply to the IGBT 201 is cut off at the time of overcurrent detection. Therefore, power consumption of the gate driver IC 102 can be suppressed. In addition, since the current supply to the IGBT 201 is cut off at the time of overcurrent detection, an increase in the gate voltage of the IGBT 201 is suppressed, so that the gate voltage can be quickly lowered at the time of soft cut-off.

C. Third Preferred Embodiment

<C-1. Configuration>

FIG. 5 is a circuit diagram of a gate driver IC 103 that is a drive circuit according to the third preferred embodiment. The gate driver IC 103 includes a gate voltage adjustment circuit 35 between the controller 34 and the PMOS 11, and other configurations are similar to those of the gate driver IC 102 according to the second preferred embodiment. A point between the controller 34 and the gate voltage adjustment circuit 35 is defined as a point C. The gate voltage adjustment circuit 35 receives a signal from the controller 34, and increases the voltage drop amount in the PMOS 11.

<C-2. Operation>

FIG. 6 is a diagram illustrating an operation of the gate driver IC 103. Hereinafter, only differences from the first preferred embodiment will be described.

When the voltage at the short circuit detection terminal SC becomes equal to or higher than the threshold voltage Vth1 and the comparator 31 outputs the alarm signal, the controller 34 turns off the PMOS 12, and outputs a signal for increasing the voltage drop amount of the PMOS 11 to the gate voltage adjustment circuit 35. As a result, the gate voltage adjustment circuit 35 increases the voltage drop amount of the PMOS 11, and the amount of the current flowing through the gate of the IGBT 201 is reduced.

<C-3. Effect>

The gate driver IC 103 of the present preferred embodiment includes the gate voltage adjustment circuit 35 as a voltage adjustment circuit between the gate terminal of the PMOS 11 and the controller 34. When the overcurrent occurs and the alarm signal is output from the comparator 31, the gate voltage adjustment circuit 35 receives a signal from the controller 34, and increases the voltage drop amount between the source and the drain of the PMOS 11. As a result, the amount of the current flowing through the gate terminal of the IGBT 201 is reduced, so that a surge voltage at the time of a short circuit of the IGBT 201 can be suppressed. The gate voltage adjustment circuit 35 can precisely control the reduction in the amount of the current flowing through the gate of the IGBT 201, and can suppress a maximum value of the gate voltage of the IGBT 201.

D. Fourth Preferred Embodiment

<D-1. Configuration>

FIG. 7 is a circuit diagram of a gate driver IC 104 that is a drive circuit according to the fourth preferred embodiment. The gate driver IC 104 includes a voltage switching circuit 36, and is similar to the gate driver IC 101 according to the first preferred embodiment in other points. The voltage switching circuit 36 is provided between the voltage source 51 and the source terminals of the PMOSs 11 and 12, and switches the power supply voltage of the PMOSs 11 and 12 from VCC1 to VCC2 that is lower than VCC1, in response to the signal received from the controller 34. A point between the voltage switching circuit 36 and the PMOSs 11 and 12 is defined as a point D.

<D-2. Operation>

Figure 8:
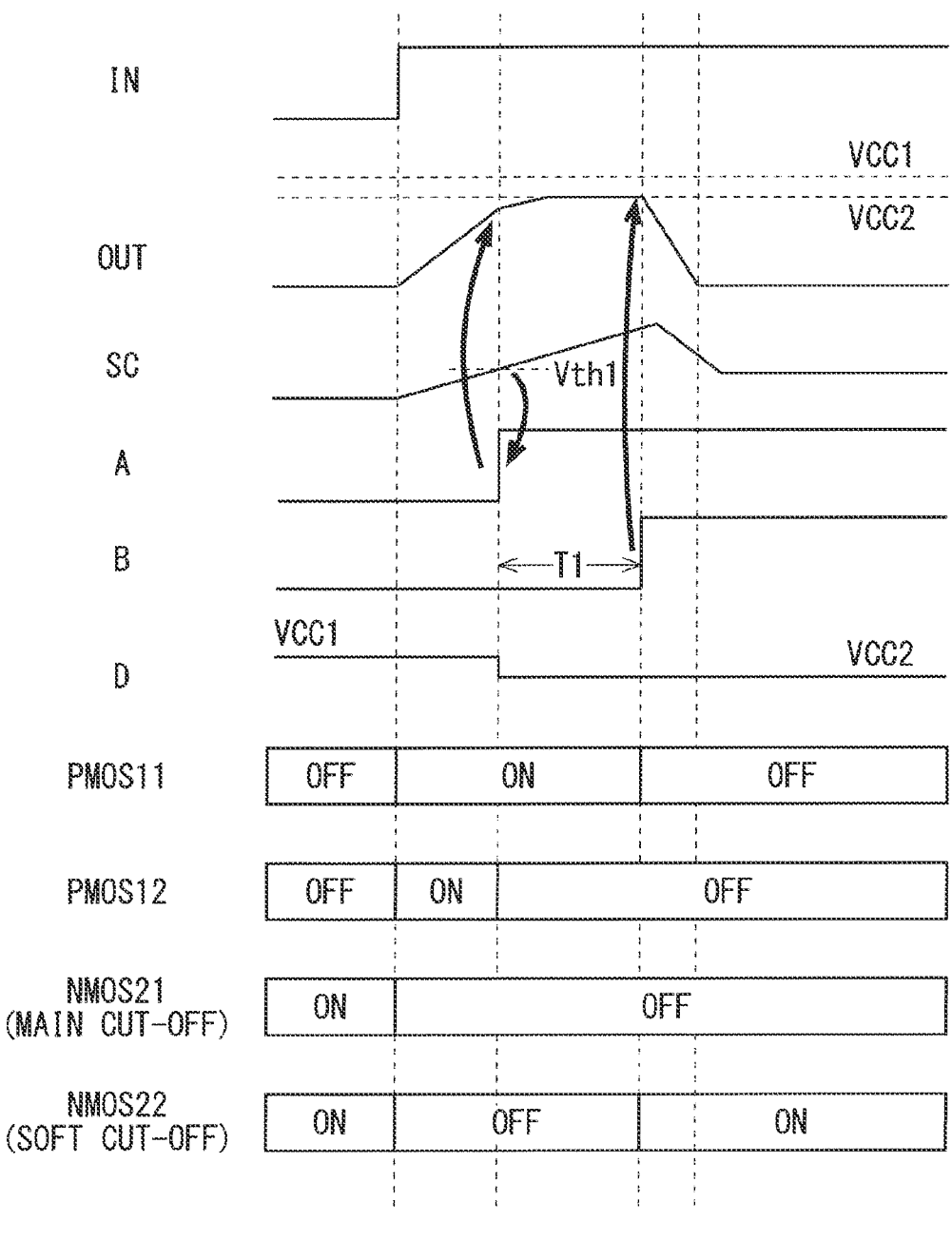
FIG. 8 is a diagram illustrating an operation of the drive circuit according to the fourth preferred embodiment.

FIG. 8 is a diagram illustrating an operation of the gate driver IC 104. Hereinafter, only differences from the first preferred embodiment will be described.

When the voltage at the short circuit detection terminal SC becomes equal to or higher than the threshold voltage Vth1 and the comparator 31 outputs the alarm signal, the controller 34 turns off the PMOS 12, and outputs a signal for adjusting the voltage to the voltage switching circuit 36. In response to the received signal, the voltage switching circuit 36 switches the voltage applied to the source terminals of the PMOSs 11 and 12 from VCC1 to VCC2.

<D-3, Effect>

The gate driver IC 104 includes the voltage switching circuit 36 provided between the voltage source 51 and the PMOSs 11 and 12. When the overcurrent occurs in the IGBT 201 and the alarm signal is output from the comparator 31, the voltage switching circuit 36 receives a signal from the controller 34, and reduces the power supply voltage input to the source terminals of the PMOSs 11 and 12 from VCC1 that is a first voltage, to VCC2 that is a second voltage. As a result, VCC2 can be easily and precisely adjusted, and the maximum value of the gate voltage of the IGBT 201 when the overcurrent occurs can be suppressed to VCC2. As a result, the surge voltage in the IGBT 201 is suppressed.

7
8

E. Fifth Preferred Embodiment

<E-1. Configuration>

FIG. 9 is a circuit diagram of a gate driver IC 105 that is a drive circuit according to the fifth preferred embodiment. As compared with the gate driver IC 101 according to the first preferred embodiment, the gate driver IC 105 includes a comparator 37 instead of the delay circuit 33.

The + input terminal of the comparator 37 is connected to the output terminal OUT of the gate driver IC 105, and the – input terminal is connected to the ground via a variable DC power supply 38. A threshold voltage Vth2 is applied to the – input terminal of the comparator 37 by the variable DC power supply 38. The comparator 37 compares the gate voltage of the IGBT 201 with the threshold voltage Vth2, and outputs a high level signal to the controller 34 when the gate voltage becomes equal to or higher than the threshold voltage Vth2. The high level signal output from the comparator 37 is referred to as a trigger signal. As described above, the comparator 37 is a control end voltage detector that detects a control end voltage of the IGBT 201, and functions as a trigger signal generation circuit that outputs a trigger signal after the comparator 31 starts outputting the alarm signal. A point between the comparator 37 and the controller 34 is defined as the point B.

In the first preferred embodiment, the continuation of the overcurrent detection for a certain period of time is used as the trigger for soft cut-off. However, in the present preferred embodiment, the fact that the potential of the shunt resistor 202 is equal to or higher than the threshold voltage Vth1 and the gate voltage of the IGBT 201 is equal to or higher than the threshold voltage Vth2 is used as a trigger for soft cut-off.

<E-2. Operation>

FIG. 10 is a diagram illustrating an operation of the gate driver IC 105. Hereinafter, only differences from the first preferred embodiment will be described.

The threshold voltage Vth2 is set to a value higher than the gate voltage when the emitter voltage of the IGBT 201 reaches the threshold voltage Vth1. Therefore, when the gate voltage of the IGBT 201 increases at the time of turn-on, the emitter voltage of the IGBT 201 first exceeds the threshold voltage Vth1, and then the gate voltage of the IGBT 201 exceeds the threshold voltage Vth2. Therefore, the comparator 37 outputs a high level signal with a delay from the comparator 31.

The controller 34 having received the high level signal from the comparator 37 turns off the PMOS 11 and turns on the NMOS 22. As a result, the gate voltage of the IGBT 201 drops, and accordingly, the voltage of the short circuit detection terminal SC also drops.

<E-3. Effect>

The gate driver IC 105 includes the comparator 37 that is a control end voltage detector that outputs a trigger signal when the gate terminal voltage of the IGBT 201 is equal to or higher than the threshold voltage Vth2. The comparator 37 functions as the trigger signal generation circuit. Therefore, with the gate driver IC 105, when a short circuit occurs in the IGBT 201, soft cut-off can be flexibly performed according to the state of the gate voltage.

F. Sixth Preferred Embodiment

<F-1. Configuration>

Figure 11:
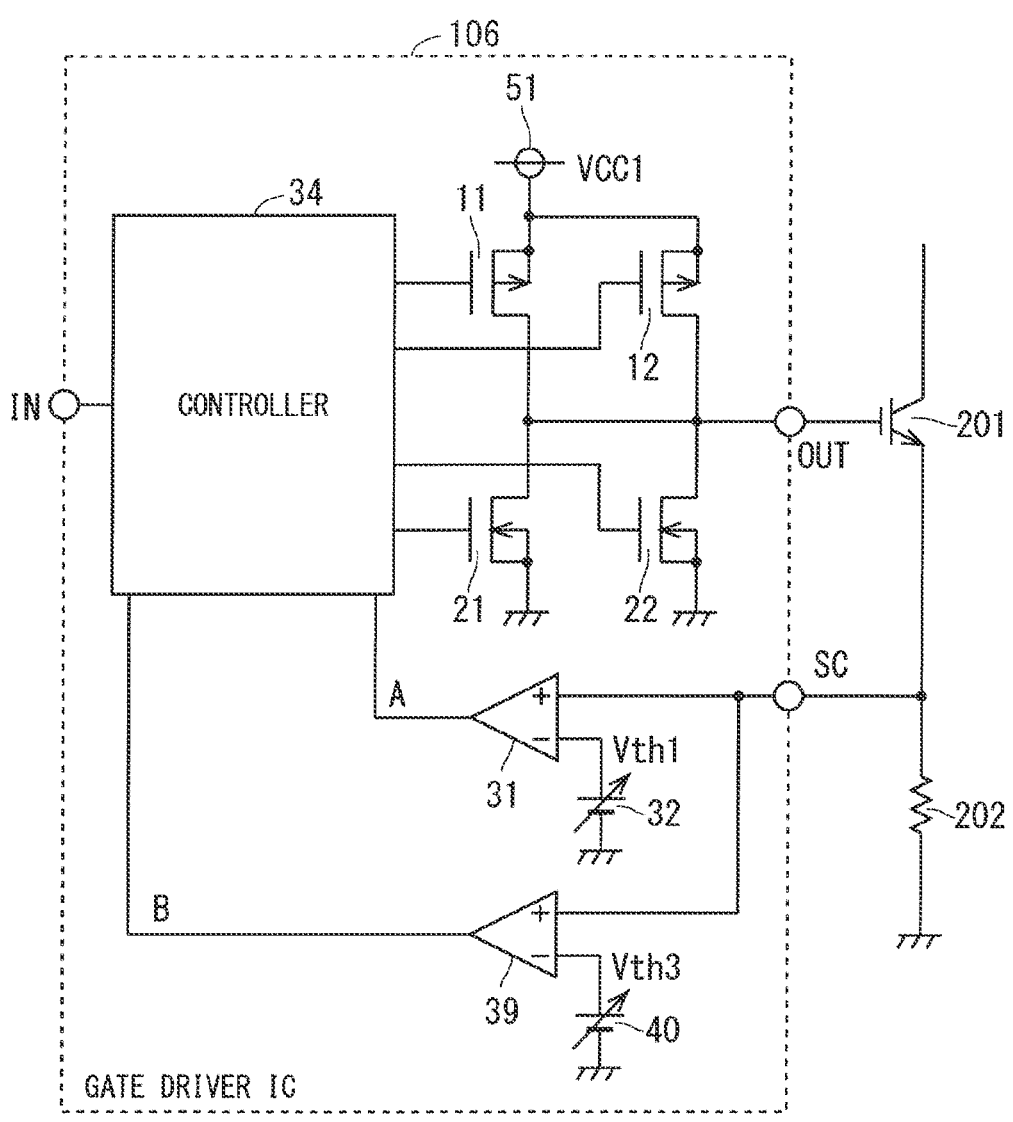
FIG. 11 is a circuit diagram of a drive circuit according to a sixth preferred embodiment.

FIG. 11 is a circuit diagram of a gate driver IC 106 that is a drive circuit according to the sixth preferred embodiment. As compared with the gate driver IC 101 according to the first preferred embodiment, the gate driver IC 106 includes a comparator 39 instead of the delay circuit 33.

The + input terminal of the comparator 39 is connected to the short circuit detection terminal SC, and the – input terminal is connected to the ground via a variable DC power supply 40. A threshold voltage Vth3 higher than the threshold voltage Vth1 is applied to the – input terminal of the comparator 39 by the variable DC power supply 40. The comparator 39 compares the emitter voltage of the IGBT 201 with the threshold voltage Vth3, and outputs a high level signal to the controller 34 when the emitter voltage becomes equal to or higher than the threshold voltage Vth3. A point between the comparator 39 and the controller 34 is defined as the point B. When the high level signal is received from the comparator 39, the controller 34 turns off the PMOS 11 and turns on the NMOS 22 to perform soft cut-off of the IGBT 201. Therefore, the high level signal output from the comparator 39 is referred to as a trigger signal.

As described above, in the present preferred embodiment, the fact that the emitter voltage of the IGBT 201 becomes equal to or higher than the threshold voltage Vth3 is used as a trigger for the soft cut-off of the IGBT 201.

<F-2. Operation>

FIG. 12 is a diagram illustrating an operation of the gate driver IC 106. Hereinafter, differences from the first preferred embodiment will be mainly described.

When the gate voltage of the IGBT 201 increases during turn-on, the emitter voltage of the IGBT 201 becomes equal to or higher than the threshold voltage Vth1, and the comparator 31 outputs an alarm signal. As a result, the controller 34 turns off the PMOS 12, and the current flowing through the gate of the IGBT 201 decreases.

Thereafter, when the gate voltage of the IGBT 201 further increases, the emitter voltage of the IGBT 201 becomes equal to or higher than the threshold voltage Vth3, and the comparator 39 outputs a soft cut-off trigger signal. As a result, the controller 34 turns off the PMOS 11 and turns on the NMOS 22 to perform soft cut-off of the IGBT 201.

<F-3. Effect>

The gate driver IC 106 includes the comparator 39. The comparator 39 outputs a trigger signal when the potential of the shunt resistor 202 becomes equal to or higher than Vth3 that is a second threshold higher than Vth1 that is a first threshold, and functions as a trigger signal generation circuit. Therefore, with the gate driver IC 106, even in a case where the overcurrent of the IGBT 201 rapidly increases, it is possible to quickly shift to the soft cut-off. As described above, with the gate driver IC 106, the cut-off operation according to the overcurrent that has actually occurred can be finely performed.

G. Seventh Preferred Embodiment

In the present preferred embodiment, the gate voltage of the IGBT 201 is controlled in two stages at the time of turn-on.

<G-1. Configuration>

Figure 13:
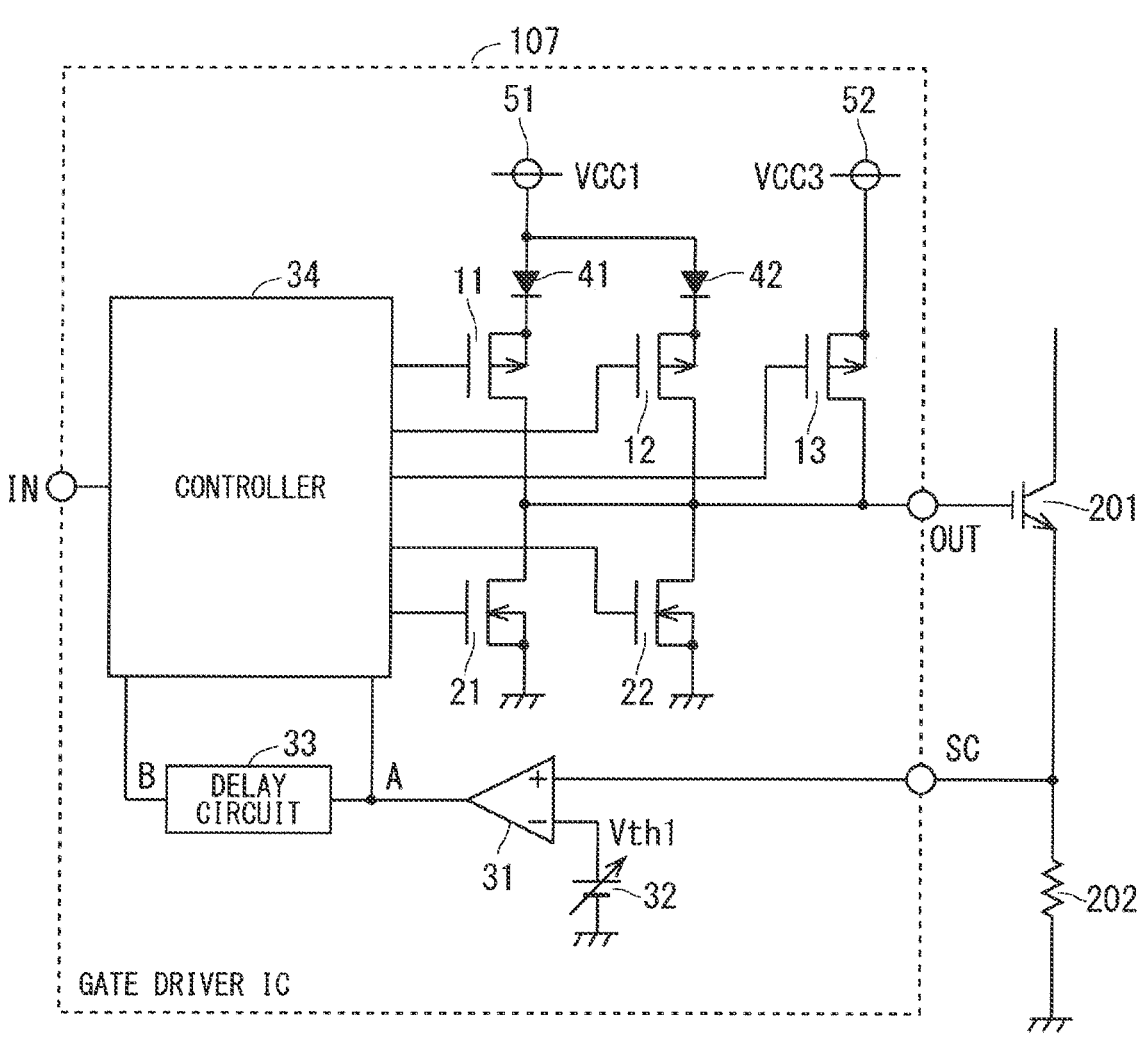
FIG. 13 is a circuit diagram of a drive circuit according to a seventh preferred embodiment.

FIG. 13 is a circuit diagram of a gate driver IC 107 that is a drive circuit according to the seventh preferred embodiment. The gate driver IC 107 includes a PMOS 13 which is a third upper switching element in addition to the PMOSs 11 and 12 as the switching elements of the upper arm. A source terminal of the PMOS 13 is connected to a voltage source 52 that supplies a voltage VCC3, and a drain terminal thereof is connected to the output terminal OUT. A gate terminal of the PMOS 13 is connected to the controller 34.

The voltage VCC3 supplied from the voltage source 52 to the PMOS 13 is higher than the voltage VCC1 supplied from the voltage source 51 to the PMOSs 11 and 12. Note that the voltage VCC1 in the present preferred embodiment may be lower than the voltage VCC1 in the above-described preferred embodiments. Other configurations of the gate driver IC 107 are similar to those of the gate driver IC 101 according to the first preferred embodiment.

<G-2. Operation>

Figure 14:
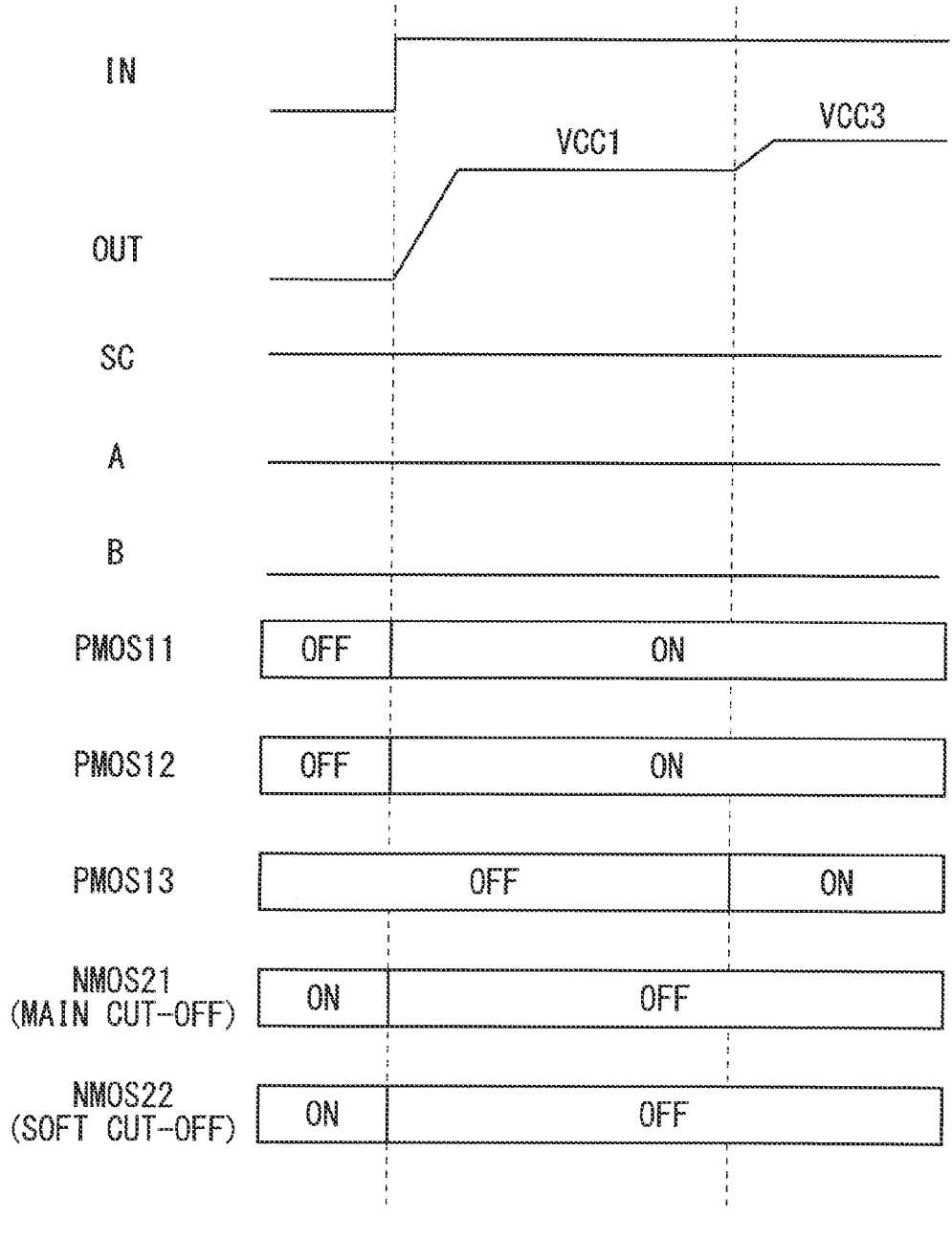
FIG. 14 is a diagram illustrating an operation of the drive circuit, in a normal state, according to the seventh preferred embodiment.

FIG. 14 is a diagram illustrating a turn-on operation of the gate driver IC 107 in a normal state, that is, when no overcurrent occurs.

When a high level signal is input to the input terminal IN, that is, when an input signal is input to the controller 34, the controller 34 turns on the PMOSs 11 and 12 and turns off the NMOSs 21 and 22. As a result, the gate voltage of the IGBT 201 increases up to VCC1.

When a predetermined time has elapsed after the input signal is input to the controller 34, the controller 34 turns on the PMOS 13. As a result, the gate voltage of the IGBT 201 increases up to VCC3.

Figure 15:
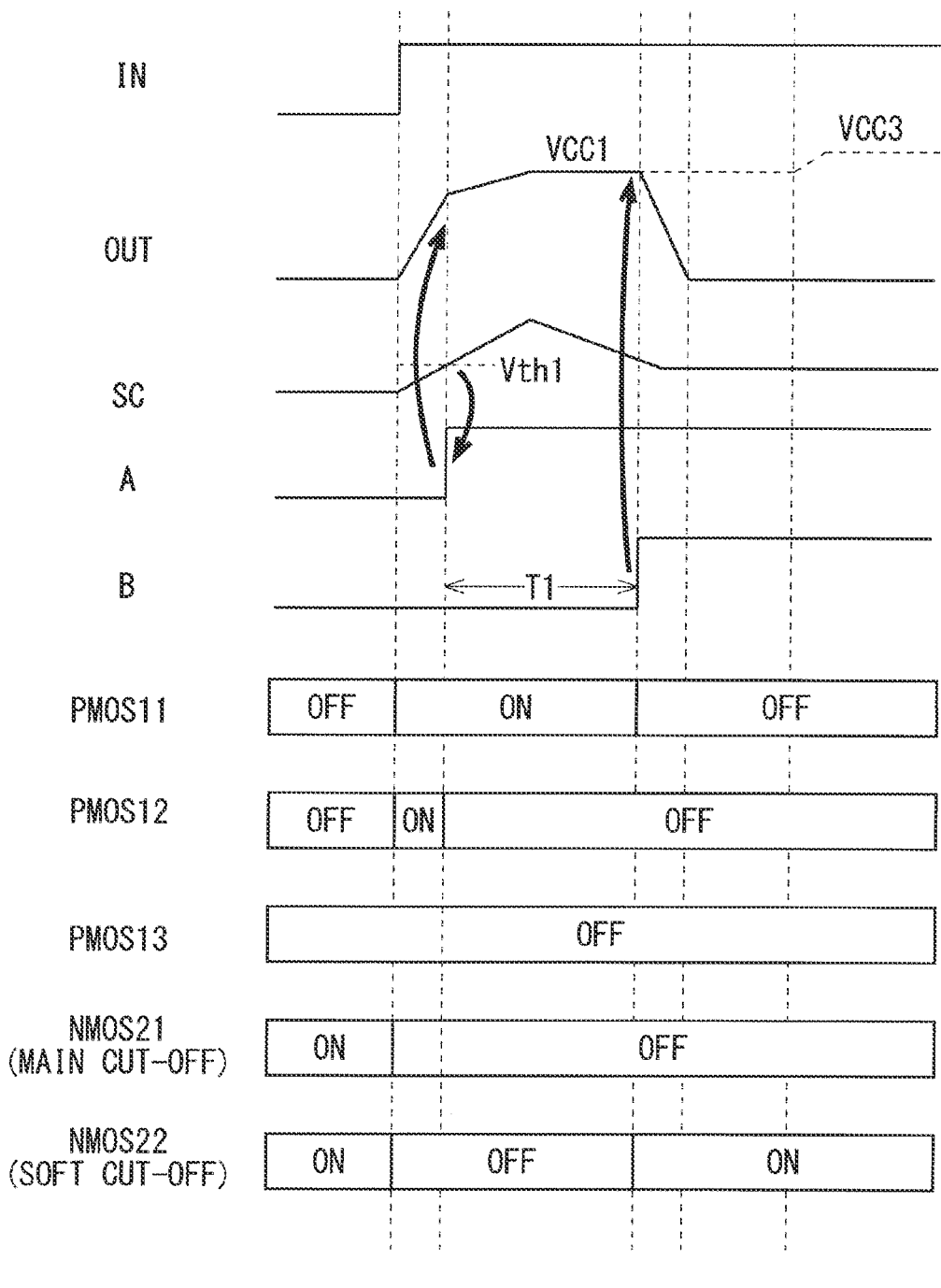
FIG. 15 is a diagram illustrating an operation of the drive circuit according to the seventh preferred embodiment when a short circuit occurs.

FIG. 15 is a diagram illustrating a turn-on operation by the gate driver IC 107 when an overcurrent occurs.

When a high level signal is input to the input terminal IN, that is, when an input signal is input to the controller 34, the controller 34 turns on the PMOSs 11 and 12 and turns off the NMOSs 21 and 22. As a result, the gate voltage of the IGBT 201 increases.

When the overcurrent occurs and the voltage of the short circuit detection terminal SC becomes equal to or higher than the threshold voltage Vth1, an alarm signal is output from the comparator 31, and the controller 34 turns off the PMOS 12. As a result, the current flowing through the gate terminal of the IGBT 201 decreases, and the increase in the gate voltage of the IGBT 201 becomes gentle. Thereafter, the gate voltage of the IGBT 201 increases, but does not increase to VCC1 or higher.

Thereafter, when the output of the alarm signal continues for the predetermined time T1, the delay circuit 33 outputs the alarm continuation signal to the controller 34. Then, the controller 34 turns off the PMOS 11 and turns on the NMOS 22. As a result, the IGBT 201 is soft cut off, and the gate voltage thereof decreases.

<G-3. Effect>

In the gate driver IC 107, in a case where the comparator 31 does not output the alarm signal after the PMOSs 11 and 12 are turned on at the time of turn-on of the IGBT 201, the controller 34 turns on the PMOS 13 after a predetermined time has elapsed from the turning on of the PMOSs 11 and 12. As a result, since the gate voltage of the IGBT 201 is suppressed to VCC1 lower than VCC3 when a short circuit of the IGBT 201 occurs, the power consumption can be suppressed, and the surge voltage at the time of the short circuit of the IGBT 201 can be suppressed. In addition, by adjusting VCC1 and VCC3, the gate voltage of the IGBT 201 that performs the two-stage control can be easily changed.

H. Eighth Preferred Embodiment

<H-1. Configuration>

FIG. 16 is a circuit diagram of a gate driver IC 108 that is a drive circuit according to the eighth preferred embodiment. The gate driver IC 108 includes a NMOS 23 which is a third lower switching element in addition to the NMOSs 21 and 22 as the switching elements of the lower arm. In addition, the gate driver IC 108 includes a sink adjustment circuit 43 between the gate terminal of the NMOS 23 and the controller 34. A source terminal of the NMOS 23 is connected to the ground, and a drain terminal thereof is connected to the output terminal OUT. Other configurations of the gate driver IC 108 are similar to those of the gate driver IC 101 according to the first preferred embodiment.

When the overcurrent occurs in the IGBT 201, the sink adjustment circuit 43 turns on the NMOS 23 after the PMOS 12 is turned off, on the basis of the signal acquired from the controller 34. As a result, the gate voltage of the IGBT 201 is lowered. A point between the controller 34 and the sink adjustment circuit 43 is defined as a point E.

<H-2. Operation>

FIG. 17 is a diagram illustrating an operation of the gate driver IC 108. Hereinafter, differences from the first preferred embodiment will be mainly described.

When the voltage of the short circuit detection terminal SC becomes equal to or higher than the threshold voltage Vth1 at the time of turn-on, the comparator 31 outputs the alarm signal to the delay circuit 33 and the controller 34. The controller 34 turns off the PMOS 12 and outputs a signal for turning on the NMOS 23 to the sink adjustment circuit 43.

The sink adjustment circuit 43 turns on the NMOS 23 in response to a signal received from the controller 34. As a result, the gate voltage of the IGBT 201 decreases.

Thereafter, when the output of the alarm signal from the comparator 31 continues for the predetermined time T1, the delay circuit 33 outputs an alarm continuation signal to the controller 34. In response to the received alarm continuation signal, the controller 34 turns off the PMOS 11 and turns on the NMOS 22 to perform soft cut-off of the IGBT 201.

<H-3. Effect>

With the gate driver IC 108, when the overcurrent occurs and the comparator 31 outputs the alarm signal, the controller 34 turns on the NMOS 23 while keeping the NMOSs 21 and 22 off. As a result, the gate voltage of the IGBT 201 quickly decreases. As a result, the short circuit current and the surge voltage are suppressed. In addition, since the PMOS 12 is turned off at the time of occurrence of a short circuit and the amount of the current flowing through the gate terminal of the IGBT 201 is reduced, the on-resistance of the NMOS 23 can be increased. That is, the size of the NMOS 23 can be reduced.

Although the preferred embodiments and the like have been described in detail above, the present invention is not limited to the above-described preferred embodiments and the like, and various modifications and substitutions can be made to the above-described preferred embodiments and the like without departing from the scope described in the claims.

Hereinafter, various aspects of the present disclosure will be collectively described as appendixes.

(Appendix 1)

A drive circuit comprising:

a plurality of switching elements that drives a power semiconductor element:

an overcurrent detector that outputs an alarm signal in a case where a potential of a shunt resistor connected between a main terminal of the power semiconductor element and a ground is equal to or higher than a predetermined first threshold;

a trigger signal generation circuit that outputs a trigger signal after the overcurrent detector starts outputting the alarm signal; and a controller that controls on and off of the plurality of switching elements, wherein the plurality of switching elements includes switching elements of an upper arm, and switching elements of a lower arm, the switching elements of the upper arm include a first upper switching element and a second upper switching element that are connected to a same power supply, the switching elements of the lower arm include a first lower switching element and a second lower switching element, and the controller turns off the second upper switching element when the alarm signal is output, and turns on the second lower switching element when the trigger signal is output.

(Appendix 2)

The drive circuit according to Appendix 1, wherein a control terminal of the first upper switching element and a control terminal of the second upper switching element are connected, and the controller turns off the first upper switching element and the second upper switching element when the alarm signal is output.

(Appendix 3)

The drive circuit according to Appendix 1, further comprising a voltage adjustment circuit that is provided between a control terminal of the first upper switching element and the controller, wherein the voltage adjustment circuit receives a signal from the controller when the alarm signal is output, and increases a voltage drop amount of the first upper switching element.

(Appendix 4)

The drive circuit according to any one of Appendixes 1 to 3, further comprising a voltage switching circuit that is provided between the same power supply and the first upper switching element and the second upper switching element, wherein the voltage switching circuit receives a signal from the controller when the alarm signal is output, and reduces a power supply voltage input to the first upper switching element and the second upper switching element from a first voltage to a second voltage.

(Appendix 5)

The drive circuit according to any one of Appendixes 1 to 4, wherein the trigger signal generation circuit is a delay circuit that outputs the trigger signal in a case where an input of the alarm signal from the overcurrent detector continues for a predetermined duration time or more.

(Appendix 6)

The drive circuit according to any one of Appendixes 1 to 4, wherein the trigger signal generation circuit is a control end voltage detector that outputs the trigger signal in a case where a control end voltage of the power semiconductor element is equal to or higher than a predetermined threshold voltage at a time of continuation of the alarm signal.

(Appendix 7)

The drive circuit according to any one of Appendixes 1 to 4, wherein the trigger signal generation circuit outputs the trigger signal in a case where a potential of the shunt resistor is equal to or higher than a second threshold that is higher than the first threshold.

(Appendix 8)

The drive circuit according to any one of Appendixes 1 to 7, wherein the switching elements of the upper arm include a third upper switching element connected to a power supply that outputs a higher voltage than the power supply to which the first upper switching element and the second upper switching element are connected, and in a case where the overcurrent detector does not output the alarm signal after the first upper switching element and the second upper switching element are turned on at a time of turn-on of the power semiconductor element, the controller turns on the third upper switching element after a predetermined time has elapsed from the turning on of the first upper switching element and the second upper switching element.

(Appendix 9)

The drive circuit according to any one of Appendixes 1 to 8, wherein the switching elements of the lower arm include a third lower switching element, and the controller turns on the third lower switching element while keeping the first lower switching element and the second lower switching element off when the alarm signal is output, (Appendix 10)

The drive circuit according to any one of Appendixes 1 to 9, wherein the power semiconductor element is a PET including a wide band gap semiconductor.

While the disclosure has been shown and described in detail, the foregoing description is in all aspects illustrative and not restrictive. It is therefore understood that numerous modifications and variations can be devised.

What is claimed is:

1. A drive circuit comprising:

a plurality of switching elements that is configured to drive a power semiconductor element;

an overcurrent detector that is configured to output an alarm signal in a case where a potential of a shunt resistor connected between a main terminal of the power semiconductor element and a ground is equal to or higher than a predetermined first threshold;

a trigger signal generation circuit that is configured to output a trigger signal after the overcurrent detector starts outputting the alarm signal; and a controller that is configured to control on and off of the plurality of switching elements, wherein the plurality of switching elements includes switching elements of an upper arm, and switching elements of a lower arm, the switching elements of the upper arm include a first upper switching element and a second upper switching element that are connected to a same power supply, the switching elements of the lower arm include a first lower switching element and a second lower switching element, and the controller is further configured to receive the alarm signal and turn off the second upper switching element when the alarm signal is output to the controller, and is further configured to receive the trigger signal and turn on the second lower switching element when the trigger signal is output to the controller.

2. The drive circuit according to claim 1, wherein a control terminal of the first upper switching element and a control terminal of the second upper switching element are connected, and the controller is further configured to turn off the first upper switching element and the second upper switching element when the alarm signal is output.

3. The drive circuit according to claim 1, further comprising a voltage adjustment circuit that is provided between a control terminal of the first upper switching element and the controller, wherein

13 the voltage adjustment circuit is configured to receive a signal from the controller when the alarm signal is output, and is further configured to increase a voltage drop amount of the first upper switching element.

4. The drive circuit according to claim 1, further comprising:

a voltage switching circuit that is provided between the same power supply and the first upper switching element and the second upper switching element, wherein the voltage switching circuit is configured to receive a signal from the controller when the alarm signal is output, and is further configured to reduce a power supply voltage input to the first upper switching element and the second upper switching element from a first voltage to a second voltage.

5. The drive circuit according to claim 1, wherein the trigger signal generation circuit is a delay circuit that is further configured to output the trigger signal in a case where an input of the alarm signal from the overcurrent detector continues for a predetermined duration time or more.

6. The drive circuit according to claim 1, wherein the trigger signal generation circuit is a control end voltage detector that is further configured to output the trigger signal in a case where a control end voltage of the power semiconductor element is equal to or higher than a predetermined threshold voltage at a time of continuation of the alarm signal.

7. The drive circuit according to claim 1, wherein the trigger signal generation circuit is further configured to output the trigger signal in a case where the potential of the shunt resistor is equal to or higher than a second threshold that is higher than the first threshold.

8. The drive circuit according to claim 1, wherein the switching elements of the upper arm include a third upper switching element connected to a power supply that outputs a higher voltage than the power supply to which the first upper switching element and the second upper switching element are connected, and in a case where the overcurrent detector does not output the alarm signal after the first upper switching element and the second upper switching element are turned on at a time of turn-on of the power semiconductor element, the controller is further configured to turn on the third upper switching element after a predetermined time has elapsed from the turning on of the first upper switching element and the second upper switching element.

9. The drive circuit according to claim 1, wherein the switching elements of the lower arm include a third lower switching element, and the controller is further configured to turn on the third lower switching element while keeping the first lower switching element and the second lower switching element off when the alarm signal is output.

10. The drive circuit according to claim 1, wherein the power semiconductor element is a FET including a wide band gap semiconductor.

* * * * *